US 9,401,223 B2

(12) United States Patent
Ziaja et al.

(10) Patent No.: US 9,401,223 B2
(45) Date of Patent: Jul. 26, 2016

(54) AT-SPEED TEST OF MEMORY ARRAYS USING SCAN

(71) Applicant: Oracle International Corporation, Redwood City, CA (US)

(72) Inventors: Thomas A Ziaja, Austin, TX (US); Murali M. R. Gala, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 109 days.

(21) Appl. No.: 14/273,851

(22) Filed: May 9, 2014

(65) Prior Publication Data

US 2015/0325314 A1 Nov. 12, 2015

(51) Int. Cl.
*G11C 29/32* (2006.01)
*G11C 29/12* (2006.01)
*G11C 7/10* (2006.01)
*G01R 31/3177* (2006.01)
*G01R 31/3185* (2006.01)
(Continued)

(52) U.S. Cl.
CPC .............. *G11C 29/32* (2013.01); *G11C 7/1036* (2013.01); *G11C 7/1078* (2013.01); *G11C 29/12* (2013.01); *G01R 31/3177* (2013.01); *G01R 31/3187* (2013.01); *G01R 31/31725* (2013.01); *G01R 31/31727* (2013.01); *G01R 31/318536* (2013.01); *G01R 31/318541* (2013.01); *G01R 31/318544* (2013.01); *G01R 31/318547* (2013.01); *G01R 31/318555* (2013.01); *G01R 31/318558* (2013.01); *G01R 31/318566* (2013.01); *G01R 31/318572* (2013.01); *G06F 11/27* (2013.01); *G11C 7/106* (2013.01); *G11C 7/22* (2013.01); *G11C 29/12015* (2013.01); *G11C 2207/007* (2013.01)

(58) Field of Classification Search
CPC ................... G01R 31/3177; G01R 31/318536; G01R 31/318544; G01R 31/318558; G01R 31/318541; G01R 31/318547; G01R 31/318555; G01R 31/318572; G01R 31/31725; G01R 31/31727; G01R 31/2851; G01R 31/318566; G01R 31/3187; G11C 7/22; G11C 7/106; G11C 2207/007; G06F 11/27
USPC ....................... 714/30, 45, 726, 729, 731, 733
See application file for complete search history.

(56) References Cited

U.S. PATENT DOCUMENTS 5,416,919 A * 5/1995 Ogino ............ G01R 31/318505
714/30
5,420,997 A * 5/1995 Browning ........... G06F 12/0846
711/211

(Continued)

*Primary Examiner* — Cynthia Britt
*Assistant Examiner* — Sazzad Hossain
(74) *Attorney, Agent, or Firm* — Meyertons Hood Kivlin Kowert & Goetzel; Erik A. Heter

(57) ABSTRACT

A method and apparatus for conducting at-speed testing of a memory array in an integrated circuit (IC) is disclosed. In one embodiment, an IC includes a memory array and a plurality of input circuits coupled to provide input signals into the memory array. Each of the plurality of input circuits includes an input flip-flop having a data output coupled to a corresponding input of the memory array, selection circuitry configured to select a data path to a data input of the input flip-flop and a data path shift register coupled to control a state of a selection signal provided to the selection circuitry, wherein the data path shift register includes a plurality of multiplexers. When operating the IC in a test mode, the plurality of input circuits is configured to provide input signals into the memory array at an operational clock speed of the IC.

18 Claims, 10 Drawing Sheets

(51) Int. Cl.
 *G01R 31/3187* (2006.01)
 *G01R 31/317* (2006.01)
 *G11C 7/22* (2006.01)
 *G06F 11/27* (2006.01)

(56) References Cited

U.S. PATENT DOCUMENTS

| | | | | |
|---|---|---|---|---|
| 5,546,406 A | * | 8/1996 | Gillenwater | G01R 31/318572 714/727 |
| 6,405,335 B1 | * | 6/2002 | Whetsel | G01R 31/318536 714/726 |
| 6,539,511 B1 | * | 3/2003 | Hashizume | G01R 31/3004 714/726 |
| 7,761,754 B1 | * | 7/2010 | Ang | G11C 8/06 714/718 |
| 7,925,937 B2 | | 4/2011 | Irby et al. | |
| 8,065,572 B2 | * | 11/2011 | Ziaja | G01R 31/318541 714/718 |
| 8,555,119 B2 | | 10/2013 | Chang et al. | |
| 2007/0220380 A1 | * | 9/2007 | Ohanyan | G01R 31/31726 714/724 |
| 2010/0180168 A1 | * | 7/2010 | Ward | G01R 31/318566 714/726 |
| 2010/0332924 A1 | * | 12/2010 | Ziaja | G01R 31/318541 714/718 |
| 2014/0149814 A1 | * | 5/2014 | Al-omari | G01R 31/318566 714/727 |

\* cited by examiner

AT-SPEED TEST OF MEMORY ARRAYS USING SCAN

BACKGROUND

1. Technical Field

This disclosure relates to integrated circuits, and more particularly, to various method and apparatus embodiments for testing memories implemented in integrated circuits.

2. Description of the Related Art

Memory arrays on integrated circuits may be tested using different test mechanisms. One such mechanism is a memory built-in self-test (MBIST). Memory testing using this mechanism is implemented with a controller that is coupled to the memory array (or arrays) to be tested. The controller may generate various types of test patterns in which data is written to and read from the memory, wherein the reading of data may be used to verify whether or not the memory passes a given test. The controller may convey signals to the memory over address lines, data lines, and control lines (e.g., read enable, write enable, bank enable), and may receive signals over data lines as well. Thus, the controller may test the functionality of the entire memory array, including address and control circuitry, as well as testing individual memory cells. The controller may also provide signals to devices external to the integrated circuit in which the memory array is implemented in order to indicate the results of a particular test.

An MBIST controller (sometimes referred to as an MBIST engine) may be implemented externally to the memory (or memories) to be tested. Additionally, an IC configured with an MBIST engine may also include comparison circuitry external to the memory (or memories) to be tested. After test data patterns are written into the memory under test, data may be read from the written locations and compared to an expected value (i.e. the value that is written into the memory). Thus, in addition to writing data into the memory under test itself, an MBIST engine may also provide the same data to comparison circuitry to verify that the correct data is read from the memory.

SUMMARY OF THE DISCLOSURE

A method and apparatus for conducting at-speed testing of a memory array in an integrated circuit (IC) is disclosed. In one embodiment, an IC includes a memory array and a plurality of input circuits coupled to provide input signals into the memory array. Each of the plurality of input circuits includes an input flip-flop having a data output coupled to a corresponding input of the memory array, selection circuitry configured to select a data path to a data input of the input flip-flop and a data path shift register coupled to control a state of a selection signal provided to the selection circuitry, wherein the data path shift register includes a plurality of multiplexers. When operating the IC in a test mode, the plurality of input circuits is configured to provide input signals into the memory array at an operational clock speed of the IC.

In one embodiment, a method includes inputting memory test information into an integrated circuit (IC) through a scan chain, wherein said inputting comprises shifting data into scannable flip-flops in a plurality of input circuits coupled to provide input signals into a memory array to be tested, wherein each of the plurality of input circuits includes an input flip-flop having a data output coupled to a corresponding input of the memory array and selection circuitry configured to select a data path to a data input of the input flip-flop. The method further includes writing data into an address of the memory array through a subset of the input circuits, reading data from the address of the memory array subsequent to said writing, wherein said reading comprises capturing data into a first multiple input shift register (MISR), and updating a value stored into the first MISR responsive to said reading. The method further includes repeating said writing, said reading, and said updating for each of a plurality of addresses. The writing, reading, and comparing of the method are performed at an operational clock speed of the IC.

BRIEF DESCRIPTION OF THE DRAWINGS

Other aspects of the disclosure will become apparent upon reading the following detailed description and upon reference to the accompanying drawings which are now described as follows.

Figure 1:
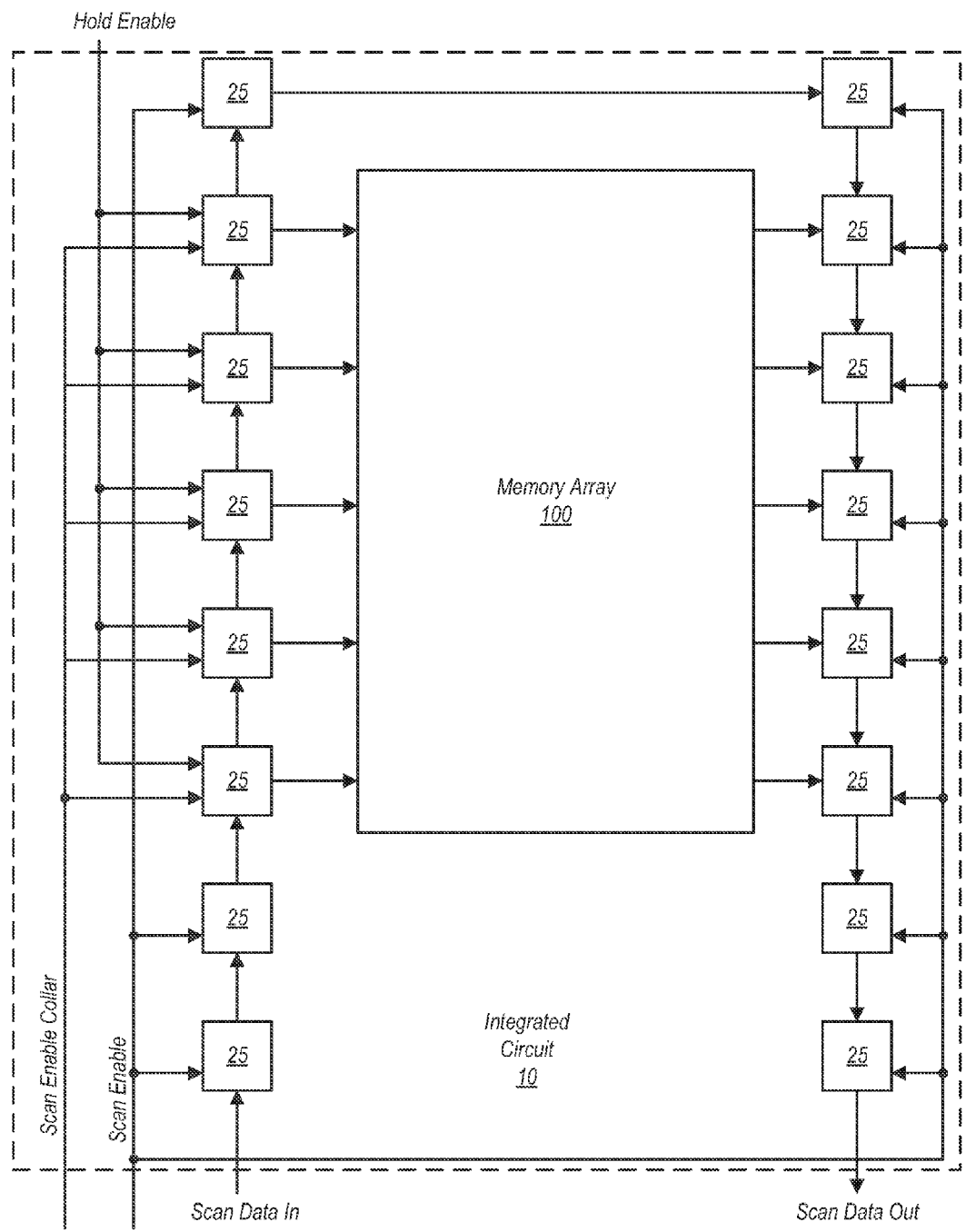
FIG. 1 is a block diagram of one embodiment of an IC having a scan chain and a memory array.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

FIG. 1 is a block diagram of one embodiment of an integrated circuit including a memory array and an exemplary scan chain. More particularly, FIG. 1 illustrates an embodiment of an IC 10 including a memory array 100 and a scan chain formed of scan elements 25. It is noted that the scan chain and the memory array shown here are exemplary and for illustrative purposes, but are not intended to be limiting in any way. It is further noted that IC 10 may include other circuitry that is not shown here for the sake of simplicity.

Memory array 100 may be any type of memory array. In one embodiment, memory array 100 may be a cache memory implemented in a processor (wherein IC 10 is a processor). However, IC 10 may be virtually any type of integrated circuit having a memory array implemented therein, while memory array 100 may be implemented using any type of memory. Some of the scan elements 25 may provide an input path for inputting data into memory 100 during normal operation (i.e. those on the input side of the memory). Similarly, some scan elements 25 may provide an output path for data that is output from memory 100 during normal operations (i.e. those on the output side of the memory). Those scan elements 25 that are actually coupled to memory array 100 may form a "collar".

Test stimulus data may be input into IC 10 via the scan chain by serially shifting bits thereof from one scan element 25 to the next. The test stimulus data may be provided bit-by-bit into the input 'Scan Data In', with each bit being shifted through elements of the scan chain until all test stimulus data has been loaded. Similarly, test result data, captured by various ones of scan elements 25 and may be shifted from IC 10 via the scan chain by serially shifting bits from one scan element to another. The test result data may be received by a test system via the output labeled 'Scan Data Out'. Certain ones of the scan elements 25 are coupled to provide a corresponding input signal into memory array 100. Using the scan elements 25 of the scan chain, test stimulus data for testing the memory array may be input into IC 10. Similarly, various ones of scan elements 25 are coupled to receive signals (in the form of test result data) from memory array. Thus, the scan chain may also be used for shifting captured memory test data from IC 10.

Each of scan elements 25 may be used in a normal scan testing scenario. More particularly, particular ones of scan elements 25 may be coupled to other logic circuitry (not shown), and may be coupled to provide test stimulus data to logic circuits coupled thereto. Scan elements 25 may also be coupled to capture test result data from logic circuits similarly coupled. Each of scan elements 25 in the embodiment shown is coupled to receive the scan enable signal. This signal may enable scan elements 25 during shift operations. During the actual test operations, the scan enable signal may be de-asserted. Test operations involving scan elements 25 may include (after de-asserting the scan enable signal) providing a clock pulse to convey test stimulus data from various ones of scan elements 25 to various logic circuits, and providing another clock pulse to enable various ones of scan elements 25 to capture test result data. After test result data has been captured by scan elements 25, the scan enable signal may be asserted once again, and the test result data can then be shifted out of IC 10 into a test system (e.g., test system 5) for further analysis. In some embodiments, scan elements 25 may be of the multiplexer-D ('mux-D') type scan elements (a multiplexer coupled to a D flip-flop), while other embodiments are possible and contemplated wherein scan elements 25 are LSSD (level sensitive scan design) scan elements.

Each of a subset of scan elements 25 is coupled to inputs of memory array 100 (e.g., to a write port, to address inputs, to control signal inputs). These scan elements may be part of an input circuit that will be discussed in further detail below. The input circuits may incorporate a hold function that allows data from the output(s) of a respective scan element 25 to be re-circulated back to its input. Accordingly, the scan elements 25 coupled to the inputs of memory array 100 may be loaded with test stimulus data for a single instance, but may provide test stimulus data to memory array 100 for multiple clock cycles. This in turn may enable the testing of memory array 100 to be conducted at-speed, i.e. at the operational clock speed of the memory over a number of clock cycles.

As used herein, the term "operational clock speed" may be a clock speed, or frequency, at which IC 10 is configured to operate during normal operation. Operational clock speed may further be defined as a highest operational clock frequency at which IC 10 is intended to operate. For example, if IC 10 is configured to operate at a maximum clock frequency of 3.5 GHz (with writes to and reads from memory 100 performed at this speed), then testing may be conducted at this clock frequency. Moreover, during testing at operational clock speed, data may be input into memory array 100 at the operational clock speed, and may also be read from and captured at the operational clock speed. Testing at operational clock speed may also be referred to as "at-speed" testing of the memory array 100. Testing a memory array at-speed may reveal faults therein that may otherwise remain undetected if testing is limited to clock frequencies that are below the operational clock speed.

Because of the different requirements of those scan elements 25 that are coupled to provide inputs into memory array 100, different control signals may be required. In this particular embodiment, each of scan elements 25 that is coupled to an input of memory array 100 is coupled to receive a scan enable signal ('Scan Enable Collar') that is separate from the scan enable signal provided to other ones of the scan elements 25. This separate scan enable signal provided to this subset of scan elements 25 may remain asserted during the entire scan testing operation. Additional details of this subset of scan elements 25 and their functioning within input circuits is discussed in further detail below.

Figure 2:
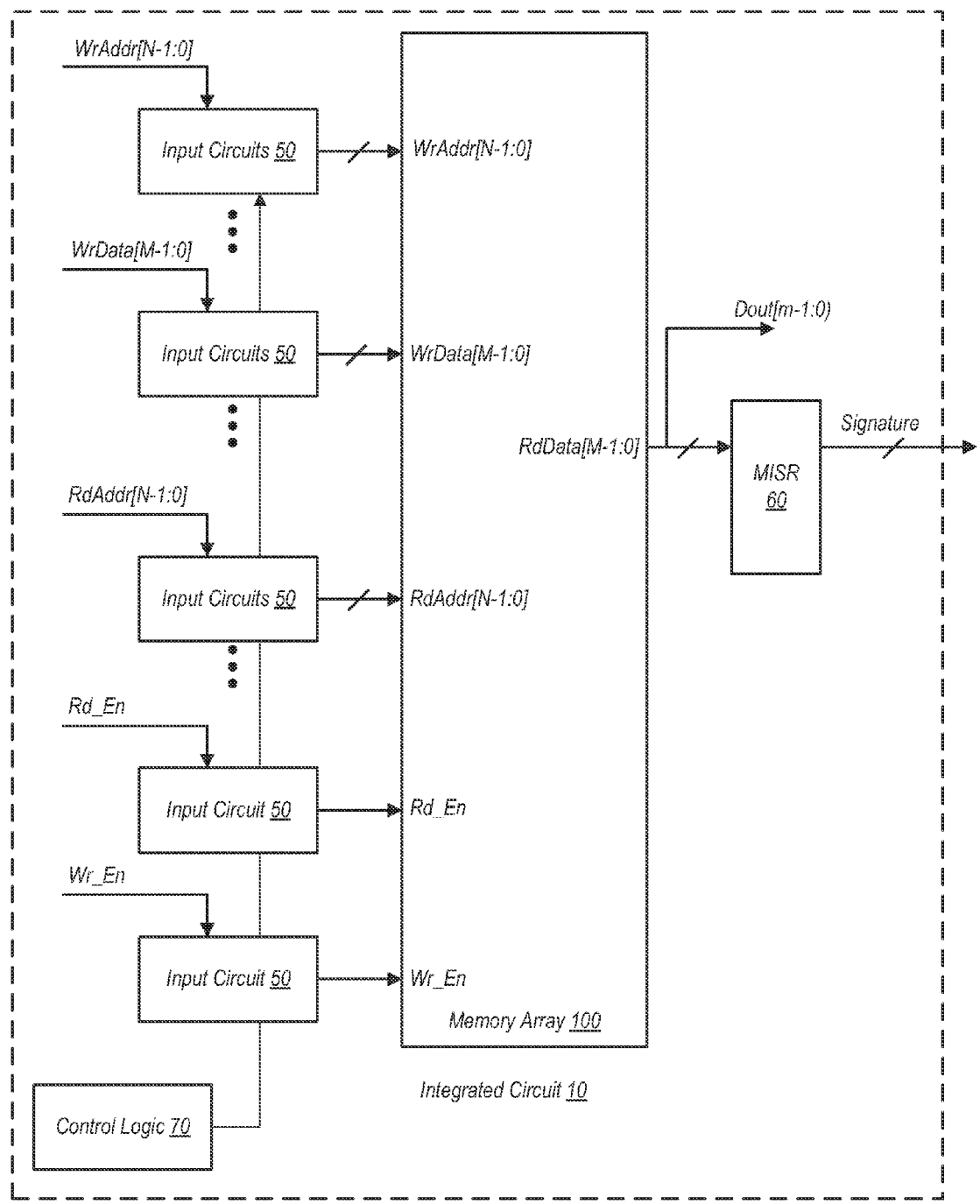
FIG. 2 is a block diagram of one embodiment of an IC including a plurality of input circuits coupled to a memory array.

FIG. 2 is a block diagram of one embodiment of an IC including a plurality of input circuits coupled to a memory array. In the embodiment shown, a number of input circuits 50 are coupled to the various inputs of memory array 100. This includes N inputs circuits 50 for the write address, N input circuits 50 for the read address (where N is an integer value greater than one), M write data input circuits 50 (where is an integer value greater than one), an input circuit 50 configured to the read enable input ('Rd_En') and an input circuit 50 coupled to the write enable input ('Wr_En').

Memory array 100 is configured to receive N-bit addresses for read and write operations. During write operations, an N-bit write address, 'WrAddr[N-1:0]' may be input through the N corresponding input circuits 50 that are coupled to the write address inputs of memory array 100. Data to be written into memory array 100, 'WrData[M-1:0], may be provided through the input circuits 50 coupled to the write data inputs. During read operations, an N-bit read address 'RdAddr[N-1:0] may be input into memory array 100 through the N input circuits 50 coupled to the read address inputs. Appropriate write and read enable signals may be provided to memory array 100 during write and read operations, respectively.

Read data is provided from memory array 100 from the 'RdData[M-1:0]' outputs. During normal operation, the data is conveyed on the data path 'Dout[M-1:0]', and may be provided to other circuitry within IC 10 (not shown). During test operations, the data output from memory array may additionally be provided to multiple input shift register (MISR) 60. MISR 60 may include a number of scan elements 25. The particular structure of one embodiment of MISR 60 is discussed in further detail below with reference to FIG. 8. In some embodiment, another set of flip-flops (not shown here) may be coupled between Dout[M-1:0] and MISR 60 to enable tapping off of the data output. This may enable analysis of the actual data output from the array when it differs from the expected.

At the beginning of test operations, MISR 60 may be seeded with an initial signature value. The signature value therein may be updated with each read operation performed during testing. That is, the signature may be updated according to the data read from memory array 100, irrespective of whether the expected data is read. If each read of data during test operations corresponds to expected data, the signature stored in MISR 60 may be updated in a predictable manner, with the final signature matching an expected signature. If one or more read operations results in incorrect data being read (i.e., the data read from memory array 100 does not match the expected data for that cycle), the signature will deviate from its expected value, and the final signature will not match the expected signature. When this occurs, the testing indicates that at least one read or write operation failed to occur in the expected manner, and that the memory may be faulty.

After all read operations conducted during testing have been completed in the embodiment of IC 10 shown here, the final signature value may be shifted from MISR 60 to a location external to IC 10 for comparison to an expected signature value. In some embodiments, a second instance of MISR 60 may be included, and comparison of the expected and actual signatures may be conducted on IC 10 itself. For example, an embodiment is contemplated where write data is provided directly to a second instance of MISR 60 while the other instance captures read data.

Each of the input circuits 50 in the embodiment shown is coupled to control logic 70, which may comprise various circuits for providing control functions during test operations. Different instances of input circuits 50 may utilize different control signals provided from control logic 70, and thus the actual circuits thereof may be distributed within IC 10, although it is shown in this drawing as a single block for the sake of simplicity. The various types of control signals generated by different portions of control logic are discussed below in reference to FIGS. 3-7.

Figure 3:
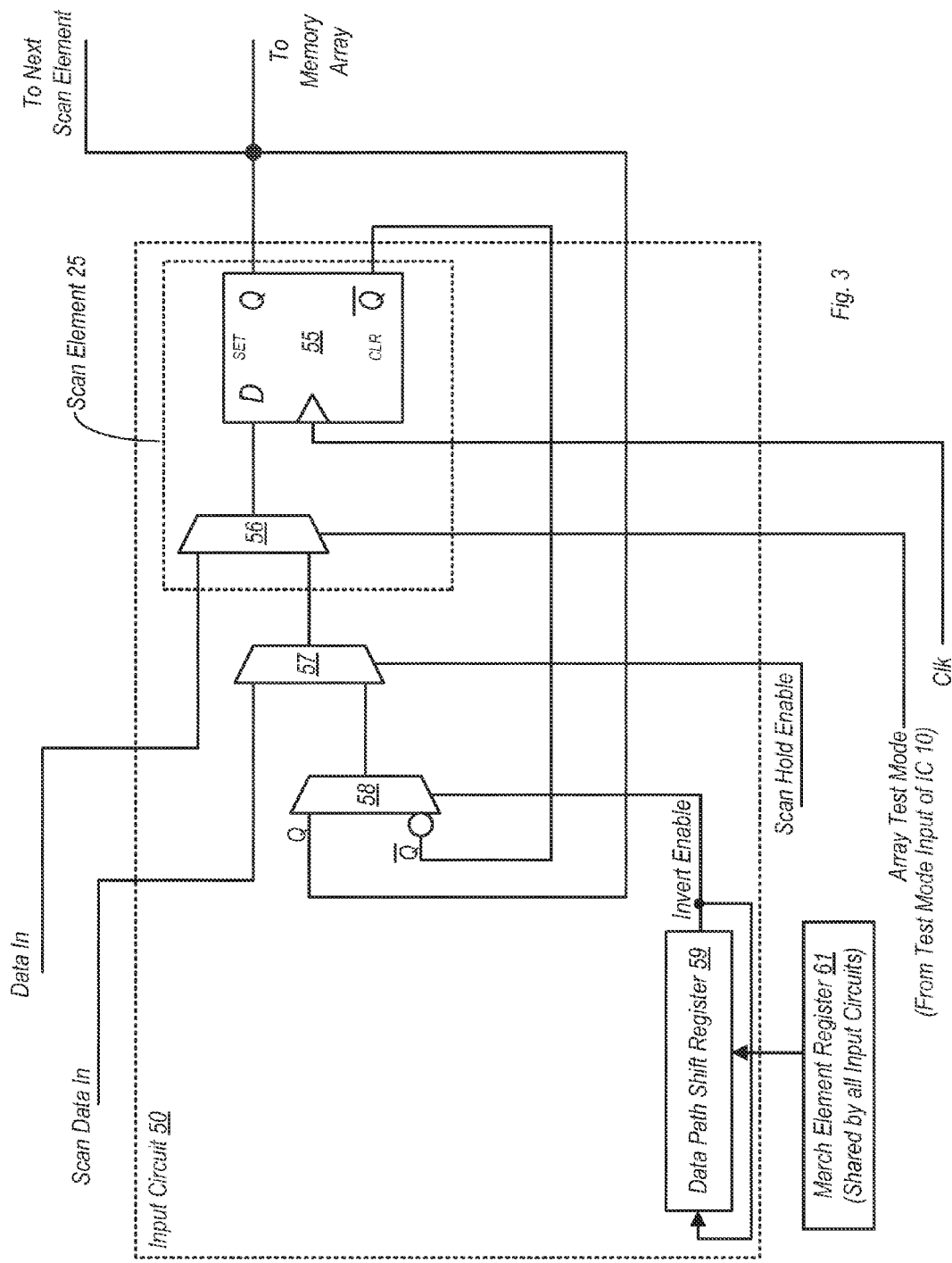
FIG. 3 is a block diagram of one embodiment of an input circuit.

FIG. 3 is a diagram one embodiment of an input circuit 50. In the embodiment shown, input circuit 50 includes a flip-flop 55 and selection circuits 56, 57, and 58 (e.g., 2-1 multiplexers). Input circuit 50 further includes a data input ('Data In'), a scan data input ('Scan Data In'), a clock signal input ('Clk'), and a plurality of enable signal inputs, 'Invert Enable', 'Scan Hold Enable', and 'Array Test Mode'. The 'Array Test Mode' signal is coupled to the 'Scan Enable Collar' signal discussed above in reference to FIG. 1, and thus assertion of one implies assertion of the other in this particular embodiment. Based on the states of the enable signals, one of the data input, the scan data input, or one of the flip-flop 55 outputs (i.e. the true output Q or the complementary output Q-bar) may be coupled to the D input of flip-flop 55.

During normal operations of the IC in which input circuit 50 is implemented, each of the enable signals may be de-asserted. In the embodiment shown, when the signal on the 'Array Test Mode' input is in a de-asserted state, selection circuit 56 couples the data input to the D input of flip-flop 55. Furthermore, during normal operation, the clock signal may operate at a normal operational frequency, previously referred to as 'at-speed'. The data input may be coupled to other circuitry that may provide various types of signals to memory array 100 (e.g., data signals, control signals, address signals).

In the embodiment shown, the scan data input is coupled to the D input of flip-flop 55 during the loading of test stimulus data. This may be accomplished by asserting the signal on the 'Array Test Mode' input, while the signals on the 'Scan Hold Enable' and 'Invert Enable' inputs remain de-asserted. Asserting the signal on the 'Array Test Mode' input may cause selection circuit 56 to select the output from selection circuit 57, which in turn may select the scan data input (since the signal on the hold enable input remains de-asserted). The scan data input of input circuit 50 may be coupled to a previous scan element in the scan chain (e.g., another instance of scan element 25), or in some cases, may be coupled to a scan data input of the IC in which it is implemented. The signal received on the scan data input may be conveyed into the D input of flip-flop 55, which may then store its corresponding logic value. Furthermore, in some embodiments, the scan data input may be coupled to another source, such as control logic 70 of FIG. 2, and may receive data therefrom during scan input/test stimulus loading operations. When scan shifting operations are in effect, the true output Q may convey, responsive to the next clock cycle, a signal having the logic value of the input signal stored by flip-flop 55 during the previous clock cycle.

During test operations, both the 'Array Test Mode' and 'Scan Hold Enable' signals may be asserted. As previously noted, when the 'Array Test mode' signal is asserted, selection circuit 56 is configured to convey the output of selection circuit 57 to the data input of flip-flop 55. When both the 'Array Test Mode' and 'Scan Hold Enable' signals are asserted, the a signal output from the output of selection circuit 58 may conveyed through selection circuits 57 and 56 to the data input of flip-flop 55.

Selection circuit 58 in the embodiment shown includes a first input coupled to the Q output of flip-flop 55, and a second input coupled to the $\overline{Q}$ output of flip-flop 55. Selection circuit may convey either one of these signals to the data input of flip-flop 55 during operation in the test mode, dependent on the output of data path shift register 59. Data path shift register 59 includes selection circuits and is explained in further detail below. The selection circuits of data path shift register 59 may in turn be controlled by march element register 61, which in this embodiment is shared by the data path shift registers 59 of all input circuits 50. During test operations, the 'Invert Enable' signal may be asserted and de-asserted a number of times depending on the desired data to be input into flip-flop 55.

After the loading of test stimulus data is complete (via scanning in through the scan chain), test operations may begin. During a first cycle of a test operation, a logic signal having the logic value most recently stored in flip-flop 55 may be conveyed to memory array 100. Furthermore, during test operations, input circuit 50 may begin re-circulating data. This may be accomplished through the selection of the Q output or the $\overline{Q}$ output of flip-flop 55 by selection circuit 58. Generally speaking, the 'Invert Enable' signal may be manipulated to cause selection circuit 58 to provide a logic 1 or a logic 0 to the data input of flip-flop 55 depending on its previous outputs. Thus, using an embodiment of the selection circuit 50 shown in FIG. 3 to implement those shown in FIG. 2, the various control, data, and address inputs may be manipulated to input the desired test stimulus into memory array. Furthermore, during test operations, the clock signal provided to the 'Clk' input of flip-flop 55 may be operated at-speed, i.e. at a frequency that coincides with a normal operational frequency. Testing may be conducted with the clock signal having a frequency up to a maximum desired or rated frequency of IC 10. Accordingly, input circuit 50 may be usable to provide test stimulus data to memory array 100 for a plurality of clock cycles, at speed, instead of for just one clock cycle when using a normal scan element without the circuitry shown in FIG. 3. This may in turn enable input circuit 50 to support testing for a plurality of clock cycles based on a single load of test stimulus data, as well as supporting at-speed testing of the memory array coupled thereto.

It is noted that while the configuration of input circuit 50 shown in FIG. 3 conforms to the mux-D scan element design, embodiments are possible and contemplated wherein such a scan element may be implemented using LSSD elements. The contemplated LSSD elements may be similarly configured to support the operations of input circuit 50 as discussed above. It should also be noted, with respect to input circuit 50 of FIG. 3, alternative embodiments may utilize an inverter having an input coupled to the true output of flip-flop 55 in order to generate the complementary output.

Figure 4:
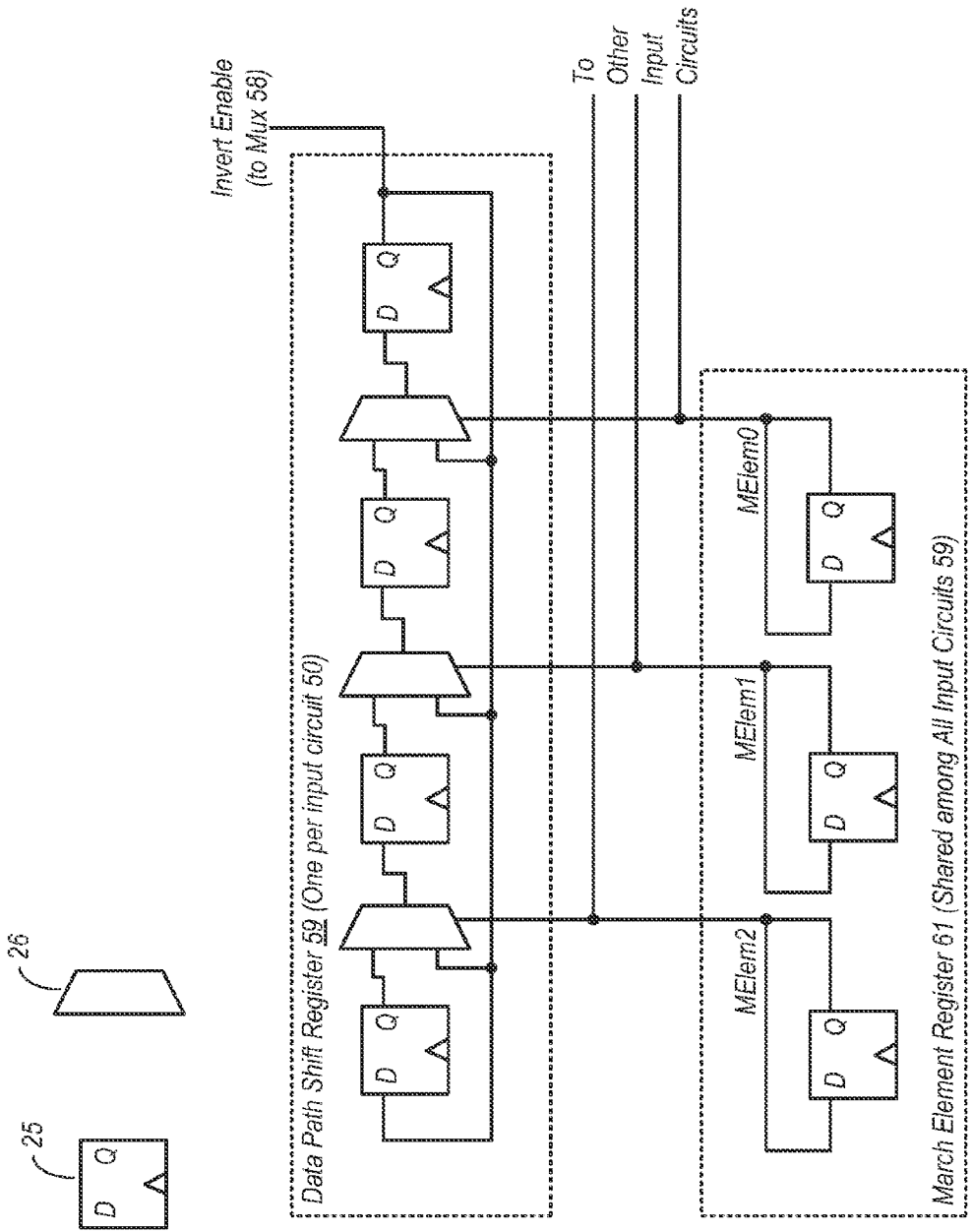
FIG. 4 is a diagram illustrating one embodiment of a shift register of an input circuit and one embodiment of a march element control register.

FIG. 4 is a diagram illustrating one embodiment of a shift register of an input circuit and one embodiment of a march element control register. In the embodiment shown, data path shift register includes a number of scan elements 25 (which are shown here as flip-flops, but are understood to include circuitry to support scan operations). The scan elements 25 are coupled in an alternating serial arrangement with selection circuits 26. Each selection circuit 26 in the embodiment shown is a 2-1 multiplexer including two inputs, one coupled to an output of a previous scan element 25, and one coupled to an output of the last scan element 25. The output of the last scan element 25 is also coupled to a select input of selection circuit 58 of the corresponding input circuit 50 in which it is implemented.

Using the selection circuits 26 and the various data bits conveyed to and through each of the scan elements 25 of data path shift register 59, the selection signal (Invert Enable') provided to selection circuit 58 may be toggled so as to change the selected input thereto. This in turn can change the selection of either the Q or Q-bar from flip-flop 55 by selection circuit 58 of the corresponding input circuit 50. This in turn can cause a change of the data input into flip-flop 55 during testing. Moreover, the data input into flip-flop 55, and thus into memory array 100, may be controlled in this manner to allow desired data to be input into memory array 100 without necessitating the loading of a large number of test vectors or generation of the same by an MBIST controller.

The select input of each selection circuit 26 is data path shift register 59 are coupled to the output of a corresponding scan element 25 of march element register 61. As previously noted, only one instance of march element register 61 is utilized in the embodiments discussed herein, with the outputs of the same coupled to selection inputs in each instance of a data path shift register 59 (and variations thereof discussed below). It is noted however that additional instances of march element register 61 may be implemented in some embodiments if desired.

Prior to conducting a memory test, the scan elements 25 may be loaded with data, which may then be used to set the select inputs of each selection circuit 26 of each data path shift register 59. Thus the flow of data through each data path shift register 59 may be determined by the data stored into march element register 61.

It is noted that in some embodiments, the scan elements 25 of march element register 61 may include additional circuitry, including selection circuit such as those discussed elsewhere.

Figure 5:
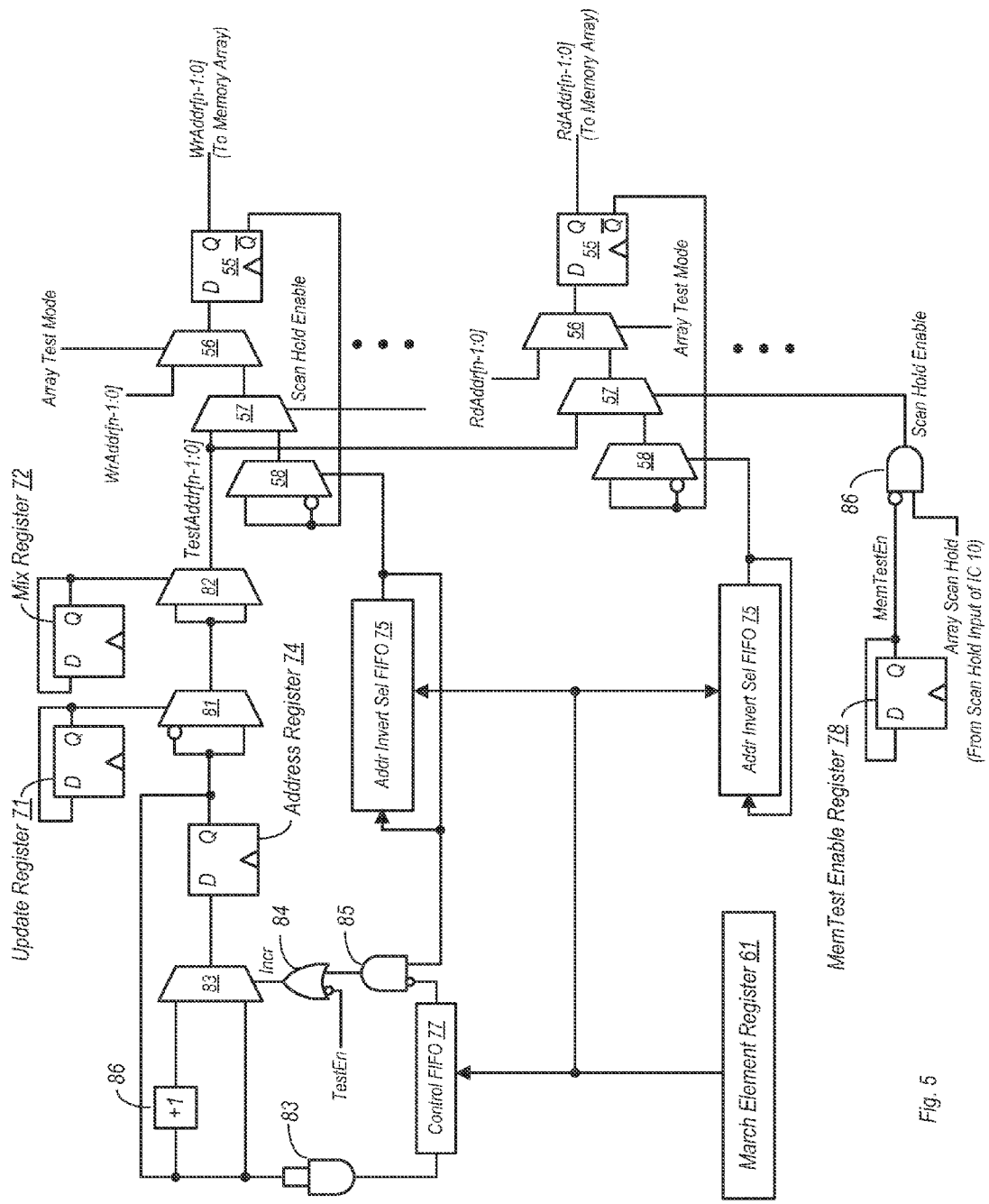
FIG. 5 is a diagram illustrating one embodiment of logic circuitry for inputting addresses into a memory array during at-speed testing.

FIG. 5 is a diagram illustrating one embodiment of logic circuitry for inputting addresses into a memory array during at-speed testing. In the illustrated example, only two input circuits for inputting address bits are shown, although it is to be understood that the number of these circuits in any particular embodiment may be equal to the total number of address bits.

In the embodiment shown, each address input circuit includes a flip-flop 55, as well as selection circuits 56, 57, and 58. Additionally, each includes an address invert selection FIFO (first-in, first-out memory) 75, which may be equivalent to the data path shift register 59 as discussed above in reference to FIG. 4. The address invert select FIFO 75 of each address input circuit in the embodiment shown controls the selection of the input by selection circuit 58, and may thus cause the variation of the address bits input to the memory array. Each selection circuit 58 in FIG. 5 is coupled to receive the Q-bar output from a corresponding flip-flop 55 on one input, and a complement of the Q-bar output on the other input. Thus, by manipulation of the selection signal to selection circuit 58, the data input into a corresponding flip-flop 55 may be controlled and altered if desired.

During test operations, the array test mode signal may be asserted and thus each selection circuit 56 may select and convey the output received from the correspondingly coupled selection circuit 57. When the array test mode signal is not asserted (i.e., during non-test operations), each selection circuit 56 may select the other input to receive an address bit from a corresponding line of an address bus in IC 10.

During test operations, the scan hold enable signal may be used to determine whether address bits output from each flip-flop 55 (or their respective complements) are recirculated back to the D input. If the scan hold enable signal is asserted, each selection circuit 57 may select the output of selection circuit 58, thereby recirculating data (or complementary data) output from a corresponding flip-flop 55. If the scan hold enable signal is not asserted, a corresponding bit from TestAddr[n-1:0] may be selected by a given selection circuit 57.

The respective states of the bits of TestAddr[n-1:0] may be determined by logic circuitry that includes selection circuit 81, 82, and 83, address register 74, update register 71, mix register 72, incrementer 86, and logic circuits 83, 84, and 85. It is noted that multiple instances of each of these circuits may be present. Additionally, the embodiment shown includes a single instance of control FIFO 77 coupled to the circuitry in order to provide control functions for the generation of addresses that are ultimately input into the memory array during test operations.

A given instance of selection circuit 83 in the embodiment shown may select an incremented address bit from a corresponding incrementer 86 based on the increment signal ('Incr'). The increment signal may be asserted based on outputs from logic gates 84 and 85, as well as the TestEn input, the output of the control FIFO, and the output of a correspondingly coupled address invert select FIFO 75. Using the incrementing functionality, the address may be incremented in successive cycles that may be consecutive or non-consecutive.

Using the mix register and selection circuit 82, addresses may allow logically ordered address to be provided in a different order so that adjacent bitcells of the memory array can be accessed in back to back cycles. For example, a mixed address may select bitcells in adjacent columns in back to back cycles, while non-mixed address may be used to select adjacent rows as is normally done.

Generally speaking, various embodiments of circuitry may be coupled to input circuits as shown in FIG. 5 to perform the address generation functions during test operations. The circuitry may include scannable elements that may be loaded with an initial address and control input states. Subsequent addresses may be generated without any additional input of information. Instead, the control inputs and addresses may be updated based on previously provided (or generated) control inputs and addresses.

Figure 6:
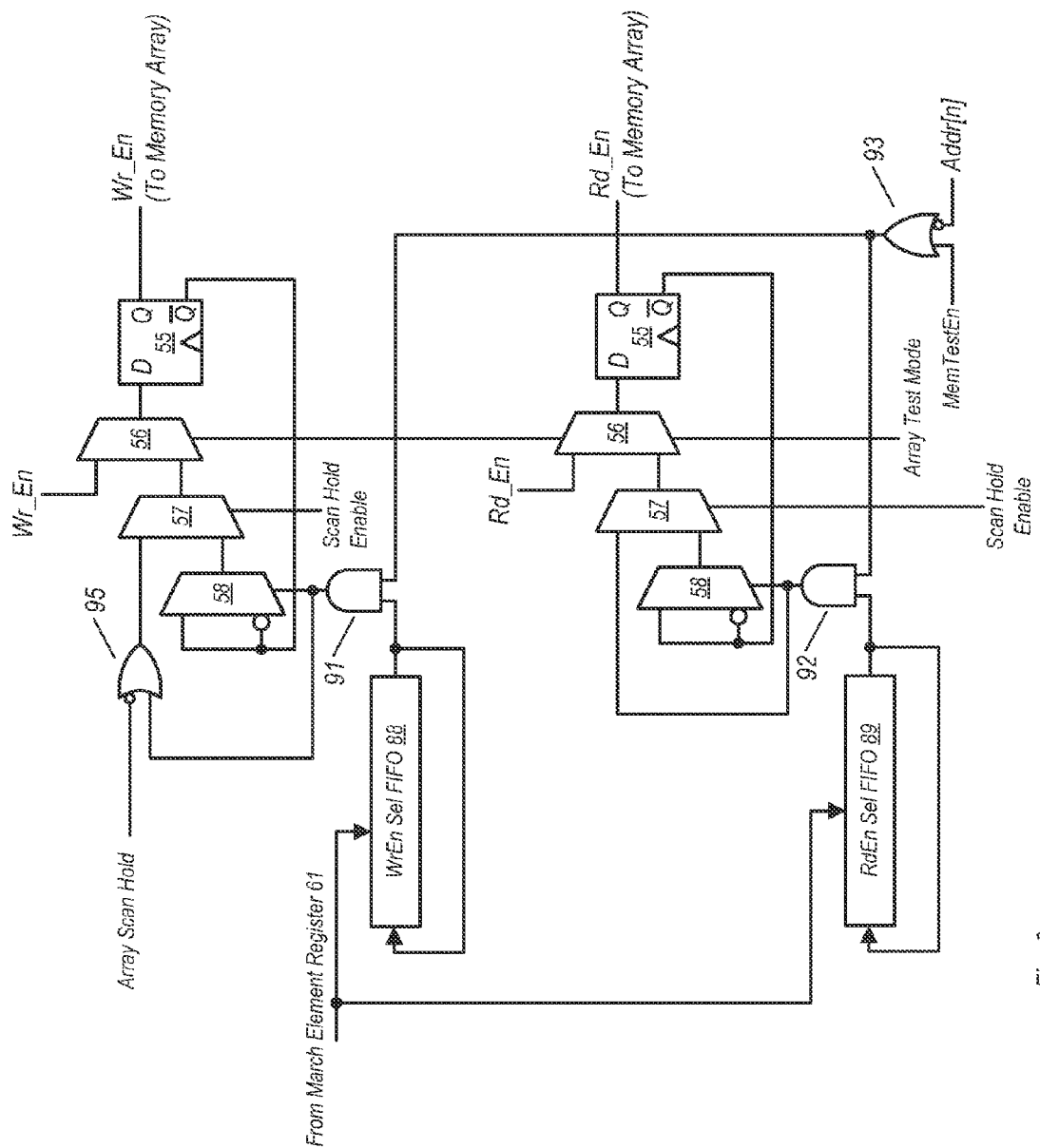
FIG. 6 is a diagram illustrating one embodiment of logic circuitry for inputting read and write enables into a memory array during at speed testing.

FIG. 6 is a diagram illustrating one embodiment of logic circuitry for inputting read and write enables into a memory array during at speed testing. In the embodiment shown, a first input circuit is arranged for inputting a write enable signal, Wr_En, to a memory array. A second input circuit in the embodiment shown is arranged for inputting a read enable signal, Rd_En, to the memory array. Both input circuits shown here include a flip-flop 55 along with selection circuits 56, 57, and 58 arranged as shown in other embodiments the input circuits discussed above. The first input circuit includes a write enable select FIFO 88, while the second input circuit includes read enable select FIFO 89. Write enable select FIFO 88 and read enable select FIFO 89 in the embodiment shown are both equivalent to data path shift register 59 discussed above with reference to FIG. 3. The select inputs of selection circuits within these FIFOs may be controlled from march element register 61, as discussed above.

In the embodiment shown, the select input to selection circuit 58 of the write enable input circuit is coupled to an output of logic gate 91 (an AND gate in this case), which is coupled to receive a first input from write enable select FIFO 88 and a second input from the output of logic gate 93. Similarly, the select input of selection circuit 58 in the read enable circuit is coupled to an output of logic gate 92, which receives input from read enable select FIFO 89 and logic gate 93. When the scan hold enable and array test mode signals are asserted, the select signals for the selection circuits 58 of the write and read enable input circuits may be toggled to assert and de-assert the write and read enable signals, respectively, as desired. When the array test mode signal is de-asserted, the write and read enables may be input through respective selection circuits 56 from other sources (e.g., a processor core). If the scan hold enable signal is not asserted, the output of 88 via 91 and 95 is selected by 57, allowing Wr_En to be controlled by 88 at the same time TestAddr of FIG. 5 is applied.

Figure 7:
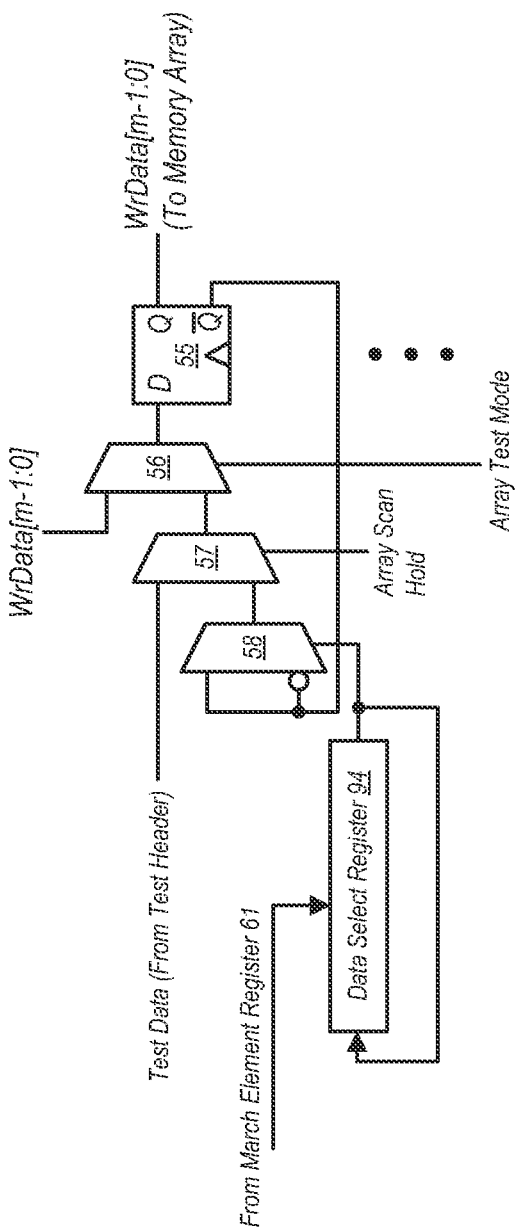
FIG. 7 is a diagram illustrating one embodiment of logic circuitry for inputting write data into a memory array during at speed testing.

FIG. 7 is a diagram illustrating one embodiment of logic circuitry for inputting write data into a memory array during at speed testing. More particularly, FIG. 7 illustrates an exemplary one of a number of data input circuits. In various embodiments, one data circuit may be present for each data bit of the full data width of the memory. For example, if the data width of the memory is 32 bits, then 32 instances of the circuit shown in FIG. 7 may be implemented.

The data input circuit as shown in FIG. 7 is similar to that shown in FIG. 3. Data select register 94 in the embodiment shown is equivalent to data path shift register 59 of FIG. 3 and is coupled to receive control inputs from march element register 61. Selection circuits 56, 57, and 58 are operable to choose the data that is input into flip-flop 55, and ultimately, into the memory array. When the array test mode signal is de-asserted, data may be received through selection circuit 56 from a corresponding line of a data bus. Otherwise, when the array test mode signal is asserted, data input into flip-flop 55 may be received from the output of selection circuit 57.

The data output from selection circuit 57 is dependent upon the state of the array scan hold signal. When asserted, the array scan hold signal causes selection circuit 57 to select the output from selection circuit 58. When the array scan hold signal is not asserted, data may be received from a test header (e.g., of a test system, as discussed blow, during scan operations). The data transferred through selection circuit 58 in the embodiment shown is dependent upon data select register 94.

One advantage that is obtainable from the arrangements shown in FIGS. 2-7 and variations thereof is that no external built-in self-test (BIST) controller is necessary for conducting long, complex tests of a memory array, where such tests include a number of read and write cycles across a series of addresses. In prior art embodiments, many ICs having one or more on-board memories includes a memory BIST (MBIST) controller that is used to generate patterns for address, data, and control signals. An MBIST controller can consume a significant amount of resources, including area for routing a significant number of signals across a portion of the IC die. In contrast, the embodiments discussed herein may conduct the same types of tests on a memory array without the need for an MBIST controller to generate patterns. Instead, initial test stimulus data may be loaded into the IC via the scan chain, and various embodiments of the input circuits discussed above may be used to effectively generate test stimulus for subsequent cycles of the clock signal. Thus, with no MBIST engine but with the various embodiments of the input circuits described herein, the full data width may be written into the memory array and read therefrom during testing, in various patterns (e.g., checkerboard patterns, etc.), and may be done at-speed.

Figure 8:
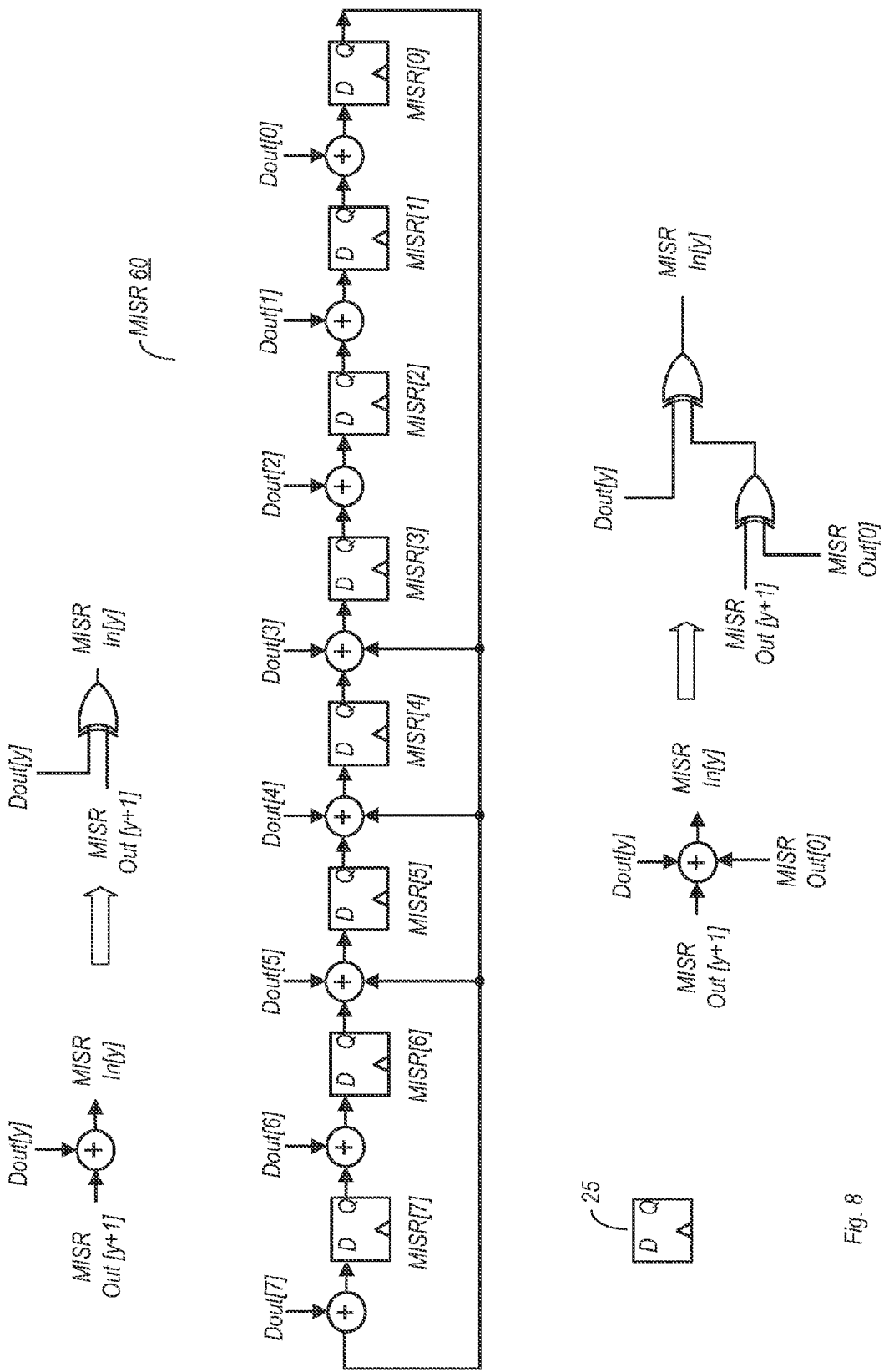
FIG. 8 is a diagram illustrating one embodiment of a multiple input signature register.

FIG. 8 is a diagram illustrating one embodiment of a multiple input signature register (MISR). In the embodiment shown, MISR 60 includes a number of scan elements 25, which exclusive-OR (XOR) circuitry coupled therebetween to form an alternating serial arrangement. The data input of each scan element in the embodiment shown is coupled to an output of XOR circuitry. In some instances, the XOR circuitry between two successive scan elements 25 includes a single XOR gate (with two inputs), while in other instances, two XOR gates (with a total of three inputs) are present. The inputs to the two-input instances of the XOR gate circuitry include a data output from memory array 100 and an output from another scan element 25. A third input in the three-input instances is from the output of the last scan element 25, labeled MISR[0].

MISR 60 is coupled to receive data bits read from the memory during read operations concurrent with testing. In this particular example, MISR 60 is configured to receive eight bits in parallel from a memory array, although the number of bits may vary from one embodiment to the next in accordance with the width of the data output by the memory. Moreover, MISR 60 may in various embodiments be configured to capture the full data width in whatever memory to which it is coupled.

In some embodiments, instead of a single MISR of full data width, multiple MISRs each encompassing a partial data width may be implemented. For example, rather than a single, 16-bit MISR, two 8-bit MISRs could be implemented, with the one receiving the least significant eight data bits and the other one receiving the most significant eight bits. However, the principle of seeding each of the MISRs with an respective initial signatures and comparing their final values with expected values may still apply as discussed above.

Prior to test operations, an initial signature value may be scanned into the scan elements of MISR 60. Thereafter, with each read operation conducted during testing, the value stored therein may be updated. If the expected value is read during each read cycle during test operations, the signature value stored in MISR 60 will be updated in a predictable fashion. If the data output by the memory during a read cycle does not match the expected value, the signature in the MISR 60 will be updated in a non-predictable manner, and all signature values after the first incorrect read will be affected. Once all read cycles have completed, the final signature value stored in MISR 60 may be compared to an expected final signature value. Matching expected and actual final signatures indicate that expected data was read from the memory during all read cycles during test operations. If the expected and actual final signatures do not match, one or more read cycles resulted in incorrect data being read from the memory.

Figure 9:
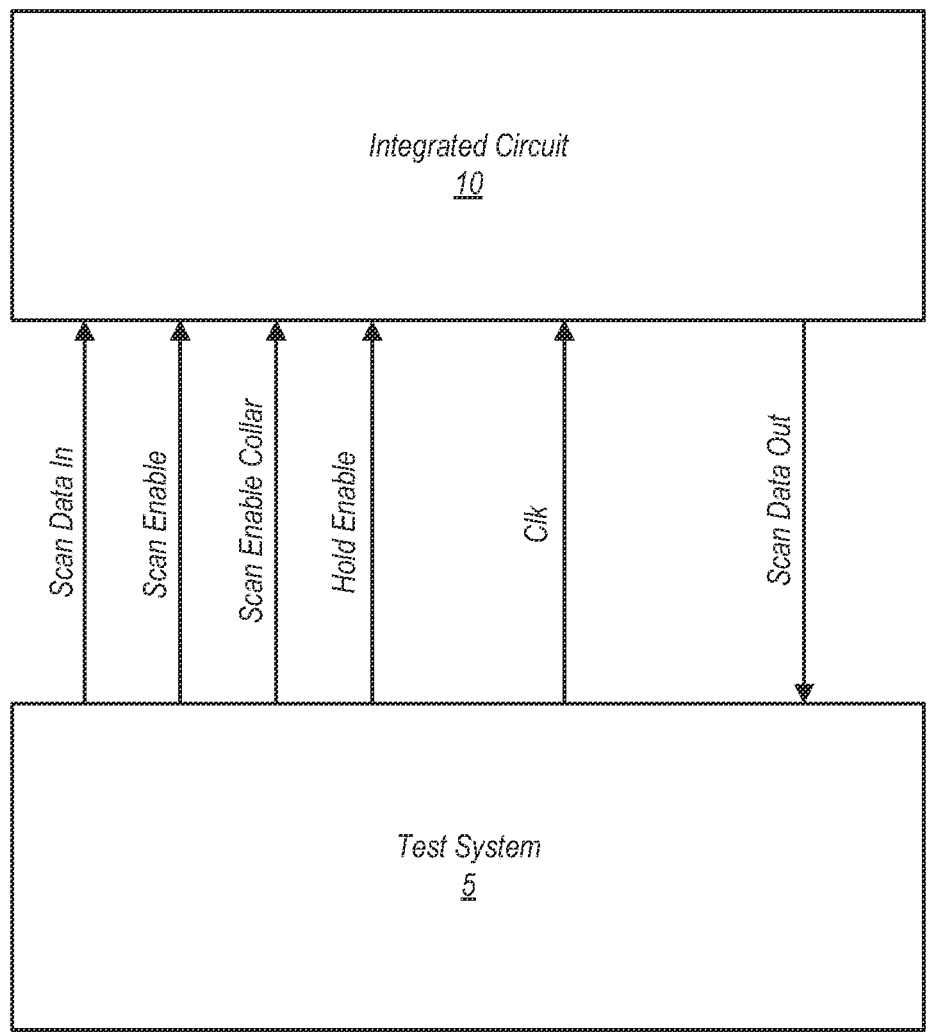
FIG. 9 is a diagram illustrating one embodiment of a test system and an IC under test.

Turning now to FIG. 9, a block diagram of one embodiment of a tester coupled to an integrated circuit (IC) for scan testing is shown. In the embodiment shown, test system 5 is coupled to input test stimulus data into and to receive test output data from IC 10. In this particular embodiment, IC 10 is an embodiment of the IC discussed above, and includes a scan chain, a memory array, and embodiments of the input circuits 50 discussed above.

Test stimulus data may be input from test system 5 into IC 10 through the input labeled 'Scan Data In'. The test stimulus data may be input serially (i.e. shifted) in accordance with the scan chain implemented in IC 10. After test result data has been captured, it may be shifted from IC 10 into test system 5 through the output labeled 'Scan Data Out'. Test result data, after being shifted from IC 10 back into test system 5, may be analyzed to determine whether or not IC 10 meets the specifications of the test (e.g., whether or not IC 10 passed or failed). During shifting operations (i.e. inputting test stimulus data or outputting test result data), a scan enable signal ('Scan Enable') may be asserted. When the scan enable signal is asserted, data may be shifted serially into IC 10 or serially from IC 10 through the elements of the scan chain therein. The shifting operation may be synchronized using a clock signal conveyed from test system 5 into the IC 10 via the clock input ('Clk').

Since some embodiments of IC 10 may have multiple scan chains, multiple test data inputs may be present (with corresponding connections to test system 5). Similarly, multiple test result outputs may also be present in embodiments of IC 10 having multiple scan chains. Alternatively, embodiments having multiple scan chains may have a single test input and a single test output, accompanied by selection circuitry in order to route the test stimulus input data and test result output data to/from the appropriate scan chains.

IC 10 may be arranged in accordance with the embodiment thereof shown in FIG. 1, i.e. including a memory array 100 and a chain of scan elements 25. IC 10 may also include various embodiments of the circuitry discussed in FIGS. 2-7. The chain of scan elements may be used to input test stimulus data that may be used for testing the memory.

As previously noted, test system 5 is coupled to provide a clock signal to IC 10. Alternatively, the clock signal may be generated by clock generation circuitry on IC 10 itself In either case, the clock signal may be used to synchronize the shifting involved with loading test stimulus data and the shifting involved with unloading test result data. The clock signal may also be used as a source clock signal for at-speed testing of the memory. During scan shifting operations, the clock signal (loading or unloading) may be provided at a different (e.g., lower) frequency than the at-speed clock signal.

Figure 10:
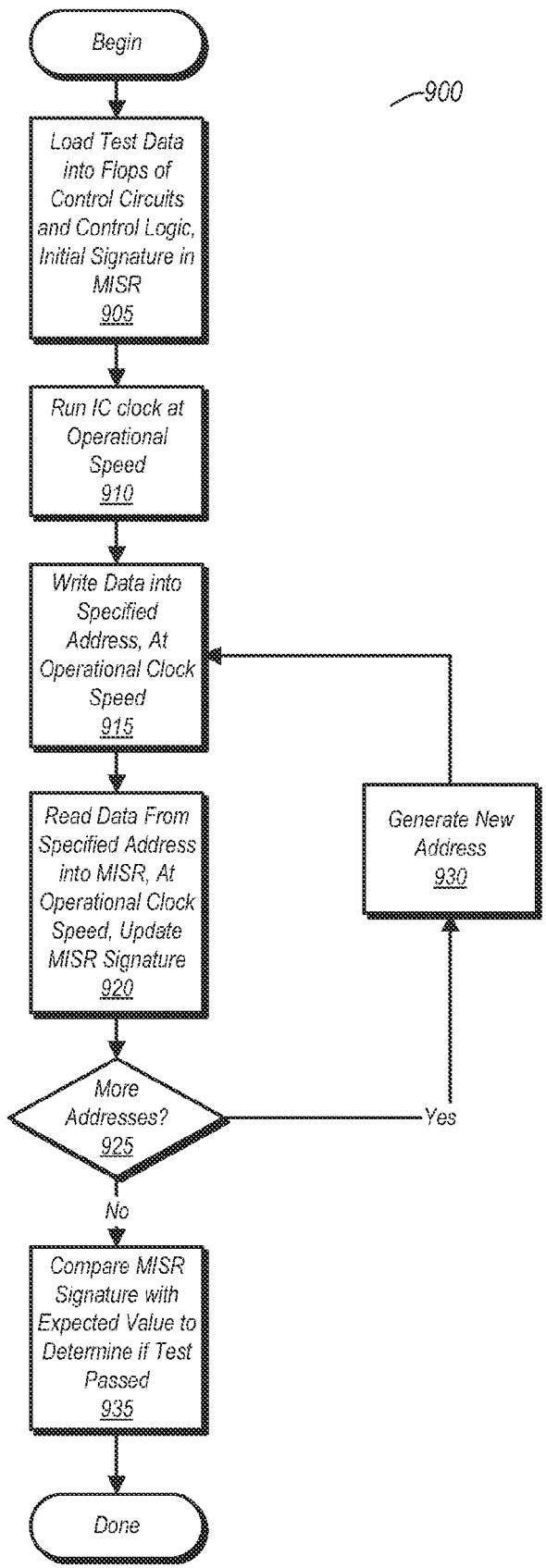
FIG. 10 is a diagram illustrating one embodiment of a method for testing a memory array at speed using scan circuitry.

FIG. 10 is a diagram illustrating one embodiment of a method for testing a memory array at speed using scan circuitry. Method 900 may be performed with various embodiments of the circuitry discussed above, and is discussed herein with reference to the same. However, method 900 is not limited to performance using only the circuits discussed above. On the contrary, it is possible and contemplated that method 900 may be performed with circuitry embodiments that are not discussed herein. It is further noted that method 900 may be performed in conjunction with a test system such as that discussed above with reference to FIG. 9. However, it is noted that method 900 is not limited to utilization with a test system.

Method 900 begins with the loading of test data into the flops of control circuits and control logic and an initial signature into an MISR (block 905). The control circuitry may include the input circuits, various registers, and control logic discussed above, which include scan elements. As used herein, the control circuits may also include those circuits used to input data to be written into the memory array during test operations. The scan operations may thus include initial data to be written into the memory, as well as initial control inputs to be provided thereto. The signature loaded into MISR is an initial signature that may be updated with each read operation.

After the initial data has been loaded, the IC including the memory under test may begin operating with its clock running at an operational speed (block 910). The operational speed as used herein may be defined as a frequency at which the IC operates during normal operations. Moreover, the operational clock speed may be the maximum frequency at which the IC is rated, and/or the maximum frequency for which the IC is rated to conduct memory read and write operations.

With the IC operating at operational clock speed, data may be written into the memory at a specified address (block 915). After the write operation is complete, a read operation may be conducted, with the data being read from the specified address into the MISR (block 920). The signature in the MISR may be updated based on the data read from the memory. Both the read and write operations may be conducted at the operational clock speed as defined above. Both the read and write operations may be conducted at the full data width of the memory. For example, if the data width for the memory under test is 32 bits (i.e., each storage location indicated by an address stores 32 bits), then each write may write 32 bits of data to the memory, while each read may read 32 bits from the memory.

If read and write operations are to be conducted for another address (block 925, yes), then a new address is generated (block 930) and the method returns to block 915 to conduct another write. The data to be written to the memory in a subsequent write operation may be the same as previously written, or may be changed from the previous data according to one of a number of different types of memory test algorithms. For example, the memory testing may be performed in accordance with a checkerboard pattern, and the data to be written for the next cycle may be altered accordingly. The circuitry discussed above may generate the new addresses and alter the new data to be written (if desired) by manipulation of the various control signals (e.g., invert enable) for each of the input circuits.

Method 900 may continue operation in the loop including blocks 915, 920, 925, and 930 for as many addresses as desired. If no further addresses are to be subject to write and read operations (block 925, no), the final MISR signature may be compared to an expected signature value to determine if the test has passed (block 935). The test may be deemed to have passed if the final MISR signature matches an expected value. The matching of an expected value may indicate that all data read from the memory was as expected and in accordance with the data written thereto. A mismatch between the final MISR signature and the expected value indicates that the data read from one or more addresses during testing was not the expected data, and thus the memory may be faulty. If desired, variations of method 900 may be performed to determine at what point and what address the fault occurred. Such variations will be apparent to those skilled in the art of memory testing.

Numerous variations and modifications will become apparent to those skilled in the art once the above disclosure is fully appreciated. It is intended that the following claims be interpreted to embrace all such variations and modifications.

What is claimed is:

1. An integrated circuit (IC) comprising:
   a memory array;
   a plurality of input circuits coupled to provide input signals into the memory array,
   wherein each of the plurality of input circuits includes:
      an input flip-flop having a data output coupled to a corresponding input of the memory array;
      selection circuitry configured to select a data path to a data input of the input flip-flop; and
      a data path shift register coupled to control a state of a selection signal provided to the selection circuitry, wherein the data path shift register includes a plurality of multiplexers and a plurality of flip-flops arranged in a serial configuration, wherein each of the plurality of multiplexers includes a first input coupled to an output of a corresponding unique preceding one of the plurality of flip-flops, wherein a second input of each of the plurality of multiplexers is coupled to an output of a last one of the plurality of flip-flops, wherein the selection circuitry is configured to select one of a true output or a complementary output from the input flip-flop based on an output signal provided by the last one of the plurality of flip-flops; and
   wherein, when operating in a test mode, the plurality of input circuits is configured to provide input signals into the memory array at an operational clock speed of the IC.

2. The IC as recited in claim 1, further comprising a control register coupled to the data path shift register of each of the plurality of input circuits, wherein the control register includes a second plurality of flip-flops coupled to provide selection signals to the multiplexers of the data path shift registers in each of the plurality of input circuits.

3. The IC as recited in claim 2, wherein the IC includes a scan chain having a plurality of serially-coupled scannable storage elements, wherein the plurality of serially-coupled scannable storage elements includes each of the flip-flops of each input circuit and the flip-flops of the control register.

4. The IC as recited in claim 1, wherein the selection circuitry comprises a first selection circuit, a second selection circuit, and a third selection circuit, wherein:
   the first selection circuit includes a first output coupled to the data input and a first select input coupled to receive a test mode signal;
   the second selection circuit includes a second output coupled to the first selection circuit and a second select input coupled to receive a scan hold signal; and
   the third selection circuit includes a third output coupled to the second selection circuit and a third select input coupled to receive an invert enable signal from the data path shift register of the corresponding one of the plurality of input circuits.

5. The IC as recited in claim 1, wherein the plurality of input circuits includes:
   a first input circuit coupled to a write enable input of the memory array;
   a second input circuit coupled to a read enable input of the memory array;
   a first subset of input circuits configured to provide bits of a write address to the memory array;
   a second subset of input circuits configured to provide bits of a read address to the memory array; and
   a third subset of input circuits configured to provide data bits to the memory array.

6. The IC as recited in claim 5, further comprising address control logic coupled to the first subset of input circuits and the second subset of input circuits, wherein the address control logic is configured to cause incrementing of the write address and the read address during operation in the test mode.

7. The IC as recited in claim 5, further comprising enable control logic coupled to the first input circuit and the second input circuit, wherein the enable control logic is configured to control assertion of a read enable signal and a write enable signal.

8. The IC as recited in claim 1, further comprising a multiple input shift register (MISR) coupled to a data output path, wherein the MISR is configured to receive data read from the memory during operation in the test mode, and wherein the MISR is configured to update a value stored therein with each successive read.

9. The IC as recited in claim 8, wherein the MISR is configured to output a final value for comparison with an expected value to determine if a test passed.

10. A method comprising
   inputting memory test information into an integrated circuit (IC) through a scan chain, wherein said inputting comprises shifting data into scannable flip-flops in a plurality of input circuits coupled to provide input signals into a memory array to be tested, wherein each of the plurality of input circuits includes an input flip-flop having a data output coupled to a corresponding input of the memory array and selection circuitry configured to select a data path to a data input of the input flip-flop; wherein inputting further includes shifting data into scannable flip-flops of a data path shift register in each of the plurality of input circuits, wherein the data path shift register in each of the plurality of input circuits includes a first plurality of flip-flops and a plurality of multiplexers arranged in a serial configuration, wherein each of the plurality of multiplexers includes a first input coupled to an output of a corresponding unique one of the plurality of flip-flops, wherein a second input of each of the plurality of multiplexers is coupled to an output of a last one of the plurality of flip-flops, wherein inputting data further comprises selection circuitry selecting one of a true output or a complementary output from the input flip-flop based on an output signal provided by the last one of the plurality of flip-flops;
   writing data into an address of the memory array through a subset of the input circuits;

reading data from the address of the memory array subsequent to said writing, wherein said reading comprises capturing data into a first multiple input shift register (MISR);

updating a value stored into the first MISR responsive to said reading;

repeating said writing, said reading, and said updating for each of a plurality of addresses; and wherein said writing, said reading, and said updating is performed at an operational clock speed of the IC.

11. The method as recited in claim 10, wherein inputting further comprises:

shifting data into a control register having a second plurality of flip-flops; and controlling respective states of selection signals provided to the multiplexers in the data path shift register of each of the plurality of input circuits.

12. The method as recited in claim 10, further comprising:

a first one of the plurality of input circuits asserting a write enable signal to enable said writing;

de-asserting the write enable signal subsequent to said writing;

a second one of the plurality of input circuits asserting a read enable signal to enable said reading; and de-asserting the read enable signal subsequent to said reading.

13. The method as recited in claim 10, further comprising:

a first subset of the plurality of input circuits inputting data into the memory array during said writing;

a second subset of the plurality of input circuits inputting the address to which data is to be written during said reading; and a third subset of the plurality of input circuits inputting the address during said reading.

14. The method as recited in claim 13, further comprising control logic causing the second and third subsets of the plurality of input circuits to increment the address for successive write-read cycles.

15. The method as recited in claim 10, further comprising comparing a value stored in the first MISR to an expected value.

16. The method as recited in claim 15, further comprising:

writing the data into a second MISR concurrent with said writing the data into the address of the memory array through a subset of the input circuits;

updating a value stored in the second MISR responsive to writing the data into the second MISR; and repeating said writing the data into the second MISR for each instance of writing data into the memory for each of the plurality of addresses;

wherein said comparing comprises comparing the value stored in the first MISR to the value stored in the second MISR.

17. A system comprising:

a memory array;

a first input circuit coupled to a write enable input of the memory array;

a second input circuit coupled to a read enable input of the memory array;

a first subset of input circuits configured to provide bits of a write address to the memory array;

a second subset of input circuits configured to provide bits of a read address to the memory array; and a third subset of input circuits configured to provide data bits to the memory array;

wherein each input circuit includes:

an input flip-flop having a data output coupled to a corresponding input of the memory array;

selection circuitry configured to select a data path to a data input of the input flip-flop; and a data path shift register coupled to control a state of a selection signal provided to the selection circuitry, wherein the data path shift register includes a plurality of multiplexers and a plurality of flip-flops arranged in a serial configuration, wherein each of the plurality of multiplexers includes a first input coupled to an output of a corresponding unique preceding one of the plurality of flip-flops, wherein a second input of each of the plurality of multiplexers is coupled to an output of a last one of the plurality of flip-flops, wherein the selection circuitry is configured to select one of a true output or a complementary output from the input flip-flop based on an output signal provided by the last one of the plurality of flip-flops;

wherein each of the input circuits is configured to input their respective signals into the memory array at an operational clock speed during operation in a test mode.

18. The system as recited in claim 17, further comprising a control register coupled to the data path shift register of each of the input circuits, wherein the control register includes a second plurality of flip-flops coupled to provide selection signals to the multiplexers of the data path shift registers in each of the input circuits.

* * * * *